United States Patent [19]
McNutt

[11] Patent Number: 5,326,996
[45] Date of Patent: Jul. 5, 1994

[54] CHARGE SKIMMING AND VARIABLE INTEGRATION TIME IN FOCAL PLANE ARRAYS

[75] Inventor: Michael J. McNutt, El Toro, Calif.

[73] Assignee: Loral Fairchild Corp., Syosset, N.Y.

[21] Appl. No.: 87,034

[22] Filed: Jul. 6, 1993

Related U.S. Application Data

[63] Continuation of Ser. No. 890,016, May 27, 1992, abandoned.

[51] Int. Cl.$^5$ .................. H01L 29/796; H01L 27/14; H01L 29/56
[52] U.S. Cl. .................... 257/229; 257/232; 257/451; 257/455
[58] Field of Search ............ 357/24, 30 C, 15; 257/229, 232, 233, 234, 449–456

[56] References Cited

U.S. PATENT DOCUMENTS

| | | | |
|---|---|---|---|
| 3,845,295 | 10/1974 | Williams et al. | 357/24 |
| 3,969,634 | 7/1976 | Su et al. | 357/24 |
| 4,040,076 | 8/1977 | Kosonocky et al. | 357/24 |
| 4,302,779 | 11/1981 | Inoue | 358/213 |
| 4,375,597 | 3/1983 | Kosonocky | 357/24 |
| 4,672,412 | 6/1987 | Wei et al. | 357/30 C |

(List continued on next page.)

FOREIGN PATENT DOCUMENTS

| | | | |
|---|---|---|---|
| 1051880 | 2/1989 | Japan | H04N 5/335 |
| 2,248,341 | 1/1992 | U.K. | |

OTHER PUBLICATIONS

F. D. Shepherd et al. entitled "Silicon Schottky retinas for infrared imaging" in IEDM Tech. Dig., 1973, pp. 310-313.

F. D. Shepherd entitled "Recent advances in platinum silicide infrared focal plane arrays." in IEDM Tech. Dig., 1984, pp. 370-373.

W. F. Kosonocky et al. entitled "160×244-element PtSi Schottky barrier IR-CCD image sensor" in IEEE Trans. Electron Devices, vol. ED-32, pp. 1564-1573, 1985.

M. Kimata et al. entitled "A 512×512-element PtSi Schottky-barrier infrared image sensor" in IEEE J. Solid-State Circuits, vol. SC-22, pp. 1124-1129, 1989.

H. Elabd et al. entitled "488×512-and 244×256-element monolithic PtSi Schottky IR focal plane ararys." in Proc. SPIE, vol. 1107, 1989.

E. T. Nelson et al. entitled "Wide field of view PtSi infrared focal plane array" Proc. SPIE, vol. 1308, pp. 36-44, 1990.

M. J. McNutt, et al. entitled "Schottky-barrier infrared focal plane arrays with novel readout structures," IEEE J. Solid-State Circuits, vol. 25, pp. 602-608, 1990.

H. Elabd et al. in "Theory and measurements of photoresponse for thin film PdSi and PtSi infrared (List continued on next page.)

*Primary Examiner*—Gene M. Munson
*Attorney, Agent, or Firm*—Kenneth W. Float; Anthony W. Karambelas

[57] ABSTRACT

Methods and apparatus for implementing charge skimming and variable integration time in focal plane arrays formed in a silicon substrate. The present invention provides for pulsing a field plate that lies over a diode disposed in the substrate in order to provide for charge skimming and variable integration time. The field plate is normally dc biased to suppress diode edge leakage. No additional structure is needed in the silicon substrate, and basic readout clocking is unaffected. Any interline transfer focal plane array can benefit from using the principles of the present invention.

11 Claims, 3 Drawing Sheets

U.S. PATENT DOCUMENTS

| | | | |
|---|---|---|---|
| 4,857,979 | 8/1989 | McNutt | 357/24 |
| 4,866,496 | 9/1989 | Audier | 357/24 |
| 4,866,497 | 9/1989 | Kosonocky | 357/24 |
| 4,894,701 | 1/1990 | Erhardt et al. | 357/24 |
| 4,994,876 | 2/1991 | Hisa | 357/24 |
| 5,003,565 | 3/1991 | Yoshida | 357/24 |

OTHER PUBLICATIONS

Schottky-barrier detectors with optical cavity." in RCA Rev., vol. 43, pp. 569–589, 1982.

P. W. Pellegrini, et al. entitled "IrSi Schottky-barrier diodes for infrared detection" in IEDM Tech. Dig., 1982, pp. 157–160.

B.-Y. Tsaur et al. entitled "IrSi Schottky-barrier infrared detectors with 10-mm cutoff wavelength" in IEEE Electron Device Lett., vol. 9, pp. 650–653, 1988.

B.-Y. Tsaur et al. entitled "128×128-element IrSi Schottky-barrier focal plane arrays for long-wavelength infrared imaging" in IEEE Electron Device Lett., vol. 10, pp. 361–363, 1989.

M. J. McNutt entitled "Edge-leakage control in platinum silicide Schottky-barrier diodes used for infrared detection" in IEEE Electron Device Lett., vol. 9, pp. 394–396, 1988.

K. Konuma et al. entitled "324×487 Schottky-barrier infrared imager" in IEEE Trans. Electron Devices, vol. 37, pp. 629–635, 1990.

CHARGE SKIMMING AND VARIABLE INTEGRATION TIME IN FOCAL PLANE ARRAYS

CROSS REFERENCE TO RELATED APPLICATIONS

This application is a continuation of U.S. patent application Ser. No. 07/890,016, filed May 27, 1992, now abandoned.

BACKGROUND

The present invention relates generally to Schottky barrier focal plane arrays, and more particularly, to Schottky barrier focal plane arrays having charge skimming and variable integration time, and methods of achieving such charge skimming and variable integration time.

Platinum silicide (PtSi) on P-silicon Schottky-barrier diodes have been proposed since 1973 for detecting infrared (IR) radiation, and large two-dimensional focal plane arrays are routinely fabricated in this technology. Schottky-barrier diodes are described in a paper by F. D. Shepherd et at. entitled "Silicon Schottky retinas for infrared imaging" in IEDM Tech. Dig., 1973, pp. 310–313, and a paper by F. D. Shepherd entitled "Recent advances in platinum silicide infrared focal plane arrays." in IEDM Tech. Dig., 1984, pp. 370–373. Fabrication of such devices is described in papers by W. F. Kosonocky et al. entitled "160×244-element PtSi Schottky barrier IR-CCD image sensor" in IEEE Trans. Electron Devices, vol. ED-32, pp. 1564–1573, 1985; M. Kimata et al. entitled "A 512×512-element PtSi Schottky-barrier infrared image sensor" in IEEE J. Solid-State Circuits, vol. SC-22, pp. 1124–1129, 1989; H. Elabd et al. entitled "488×512- and 244×256-element monolithic PtSi Schottky IR focal plane arrays." in Proc. SPIE, vol. 1107, 1989; E. T. Nelson et al. entitled "Wide field of view PtSi infrared focal plane array" Proc. SPIE, vol. 1308, pp. 36–44, 1990; and M. J. McNutt, et al. entitled "Schottky-barrier infrared focal plane arrays with novel readout structures," IEEE J. Solid-State Circuits, vol. 25, pp. 602–608, 1990.

At the same time, the use of back-side illumination and a front-side reflecting cavity have improved diode quantum efficiency to the point where temperature resolution better than 0.1° K. is achieved as is described by H. Elabd et al. in "Theory and measurements of photoresponse for thin film PdSi and PtSi infrared Schottky-barrier detectors with optical cavity." in RCA Rev., vol. 43. pp. 569–589, 1982. Recently, iridium silicide has been proposed for extended wavelength sensitivity, and large arrays have been demonstrated in the long-wave infrared spectrum. These are discussed in papers by P. W. Pellegrini, et al. entitled "IrSi Schottky-barrier diodes for infrared detection" in IEDM Tech. Dig., 1982, pp. 157–160, B.-Y. Tsaur et al. entitled "IrSi Schottky-barrier infrared detectors with 10 $\mu$m cutoff wavelength" in IEEE Electron Device Lett., vol. 9, pp. 650–653, 1988, and B.-Y. Tsaur et al. entitled "128×128-element IrSi Schottky-barrier focal plane arrays for long-wavelength infrared imaging" in IEEE Electron Device Lett., vol. 10, pp. 361–363, 1989.

Nevertheless, the relatively low quantum efficiency of Schottky-barrier diodes places a premium on relative diode area or fill factor. The reflecting plate may be dc biased as a field plate to control dime edge leakage as is described in a paper by M. J. McNutt entitled "Edge-leakage control in platinum silicide Schottky-barrier diodes used for infrared detection" in IEEE Electron Device Lett., vol. 9, pp. 394–396, 1988, and in U.S. Pat. No. 4,857,979 entitled "Platinum Silicide Imager" issued to M. J. McNutt. This eliminates the N guard-ring structure commonly used for leakage suppression as is discussed in some of the above references, and increases the focal plane array area available for the sensor diode. The increased fill factor captures more photons and improves the focal plane array sensitivity.

The provision of variable integration time provides an electronic shutter function that is a desirable addition to any focal plane array. However, it normally requires a common gate and drain adjacent to each sensor diode to drain off charge such that the diode potential is pinned and signal charge integration is temporarily suppressed. This has the disadvantage of using chip area that could be allocated to the diode, thus reducing fill factor. Another conventional approach is discussed in a paper by K. Konuma et al. entitled "324×487 Schottky-barrier infrared imager" in IEEE Trans. Electron Devices, vol. 37, pp. 629–635, 1990, in which the device sweeps out excess charge through a separate readout cycle, but this requires higher clock frequencies and limits the range over which the integration time can be varied. The normal readout and the charge sweep-out functions have to be compressed into the time otherwise allowed for readout only.

U.S. Pat. No. 4,866,496 issued to Audier discloses a charge skimming function that is similar in concept to that of the present invention. However, the charge skimming of the Audier patent is achieved through the use of multiple additional gates that partition the signal charge into a part that is saved and a part that is discarded. This circuit is predominantly aimed at mercury-cadmium-telluride detectors. However, besides providing the additional function of variable integration time, the present invention eliminates the need for the additional gate circuitry that is required by Audier. The efficient use of space is critical in monolithic focal plane arrays (e.g. Schottky barrier arrays).

U.S. Pat. No. 4,896,340 issued to Caro describes a general scheme for the partial input of signal charge into a charge coupled device. This patent is directed to hybrid mercury-cadmium-telluride focal plane arrays which have specific input requirements for biasing the diode and handling the large current. The Caro patent is similar to Audier in that it eliminates part of the signal charge, thus having a function similar to the present charge skimming function, but the implementation requires additional circuitry on the chip and is quite different in its execution.

U.S. Pat. No. 4,994,876 issued to Hiss describes a three dimensional storage structure that is used to increase the storage capacity of a readout circuit. This patent discloses increasing the mount or charge that can be handled, and is also aimed at hybrid mercury-cadmium-telluride arrays.

U.S. Pat. No. 5,003,565 issued to Yoshida describes a method for supplying individual control voltages to charge skimming circuits at each sensor site in the array. This is useful for eliminating the differences in diode sensitivity. This charge skimming technique is commonly used in the art. The present invention is not directed at tuning the charge skimming at each diode, and the thrust of the present invention is toward eliminating the charge skimming apparatus that is used in the Yoshida patent and elsewhere.

Accordingly, it is an objective of the present invention to provide for a focal plane array, and more particularly a Schottky-barrier diode focal plane array, having charge skimming and variable integration time that does not require additional readout circuit structure as is required in conventional circuit designs, and to methods for providing charge skimming and variable integration time in Schottky-barrier diode focal plane arrays.

SUMMARY OF THE INVENTION

In order to achieve the above and other objectives, the present invention provides for a focal plane array having charge skimming and variable integration time that does not require additional readout circuit structure, and methods for achieving such charge skimming and variable integration time. In the present invention, a field plate is capacitively coupled to a floating-gate (sensor) Schottky-barrier diode. By pulsing the field plate with a negative voltage, the Schottky-barrier diode is briefly shorted to dump charge to the substrate, reset its potential, and suppress charge integration therein. The location of the pulse within a frame period determines the starting time for charge integration. The voltage of the pulse determines the amount of charge that is dumped, and may be used to produce charge skimming in which only a portion of the integrated signal charge is transferred to a focal plane array readout circuit.

An advantage of the present invention is that charge skimming and variable integration time (providing for an electronic shutter) are achieved without adding any structure to the readout circuit. The present invention is achieved by pulsing the field plate that lies above the Schottky-barrier diode. The field plate takes up no additional lateral space which is a space saving aspect of the present focal plane array structure.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 1b shows a partial pixel element cross section of the Schottky-barrier focal plane array of FIG. 1a;

FIG. 2 shows a series of electron potential diagrams depicting the operation of charge skimming and variable integration time functions in the Schottky-barrier focal plane array of FIG. 1, and wherein

FIG. 3 shows oscilloscope traces of the output from the Schottky-barrier focal plane array of FIG. 1 confirming the operation of charge skimming and variable integration time functions, and wherein

DETAILED DESCRIPTION

Figure 1A:
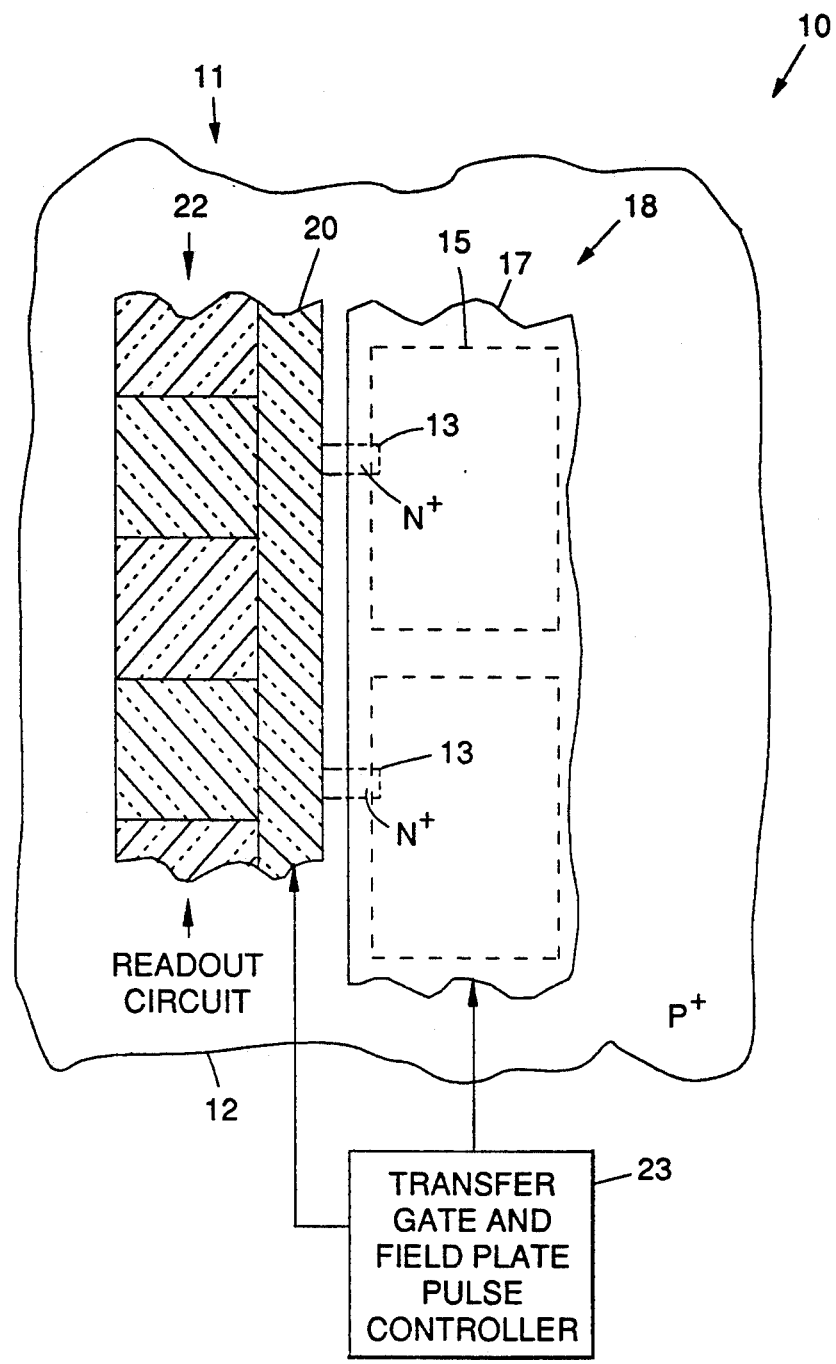
FIG. 1a shows a top plan view of a Schottky-barrier focal plane array in accordance with the principles of the present invention.
Figure 1B:
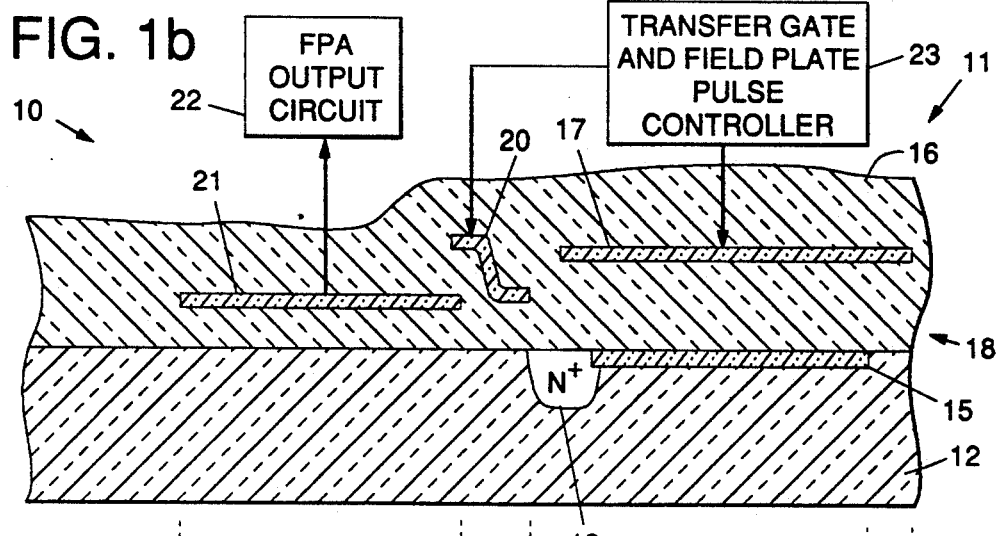

Referring to the drawing figures, FIG. 1a shows a top plan view of a plurality of pixel elements 11 of a portion of a Schottky-barrier focal plane array 10 in accordance with the principles of the present invention, and FIG. 1b shows a cross section of a pixel element 11. The pixel element 11 comprises one Schottky-barrier diode and one charge readout cell. The pixel dement 11 includes a P-type silicon substrate 12 having an N+ doped region 13 in contact with a cathode plate 15. The cathode plate 15 comprises platinum silicide (PtSi) material, for example, and is disposed on the surface of the P-silicon substrate 12, and a thick (~5000 Å) oxide dielectric isolation layer 16 is disposed between the cathode plate 15 and a field plate 17. The field plate 17 may be comprised of aluminum interconnect material, for example. The cathode plate 15 and P-silicon substrate 12 form a Schottky-barrier diode 18, also referred to herein as a platinum-silicon (PtSi) sensor diode 18. The field plate 17 lies above the Schottky-barrier diode 18. To the left of the Schottky-barrier diode 18 (as shown in FIG. 1) is a diode transfer gate 20 that is isolated from the surface of the P-silicon substrate 12. A readout gate 21 is disposed to the left of the diode transfer gate 20 (as shown in FIG. 1b) and a portion of the diode transfer gate 20 overlaps the readout gate 21. The diode transfer gate 20 and readout gate 21 are typically formed of polysilicon material. The dielectric isolation layer surrounds the transfer gate 20 and the readout gate 21. A typical charge readout/output circuit 22 that incorporates such transfer gates 20 and readout circuits 21 is described in U.S. Pat. No. 4,857,979, issued to Michael J. McNutt, for example. A field plate pulse controller 23 is coupled to the field plates 17.

The operation of the pixel element 11 of the Schottky-barrier focal plane array 10 will be discussed with reference to FIG. 2. FIG. 2 shows a series of electron potential diagrams depicting the operation of the charge skimming and variable integration time functions in the Schottky-barrier focal plane array 10 of FIG. 1. More specifically, FIG. 2 shows a series of electron potential diagrams for the relevant portions of the structure of the focal plane array pixel element 11 of FIG. 1. The potentials shown in FIG. 2 are at the surface of the P-silicon substrate 12. The readout gate 21 is normally a charge-coupled device (CCD) gate to which charge 25 (represented as a potential difference and shown by cross hatching) is transferred from the cathode plate 15 and contacting N+ region 13 of the Schottky-barrier diode 18. A series (not shown) of these gates will normally transfer diode signal charge to the focal plane array readout/output circuit 22. The diode transfer gate 20 is pulsed once per frame to transfer charge 25 to the readout circuit 22. When the diode transfer gate 20 is off, it isolates the floating Schottky-barrier diode 18 during signal charge 25 integration.

Figure 2A:
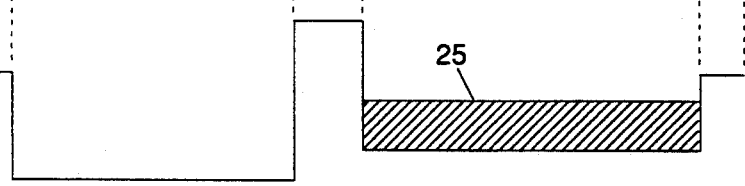
FIG. 2a shows the end of the charge integration time.
Figure 2B:
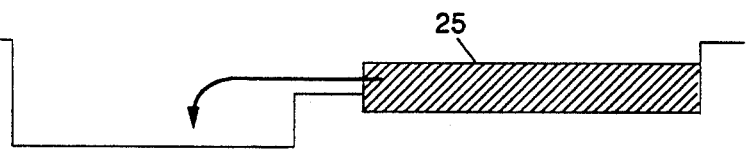
FIG. 2b shows signal charge transfer to the readout circuit.
Figure 2C:
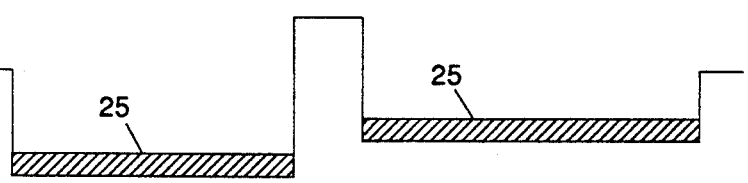
FIG. 2c shows the condition that isolates the diode from the readout gate.

The potential diagram of FIG. 2a represents the end of the charge integration time. The cross-hatched region is the integrated photoinduced charge 25 for the particular pixel element 11. It is confined between the diode transfer gate 20 and the P-silicon substrate 12. In FIG. 2b, the diode transfer gate 20 is turned on to transfer the signal charge 25 to the CCD readout gate 21. Some or all of the charge 25 can be transferred depending on the pulsed level of the potential of the transfer gate 20. This provides for variable charge skimming. The transfer gate 20 is returned to its original potential as shown in FIG. 2c to again isolate the PtSi sensor diode 18 from the readout gate 21.

Figure 2D:
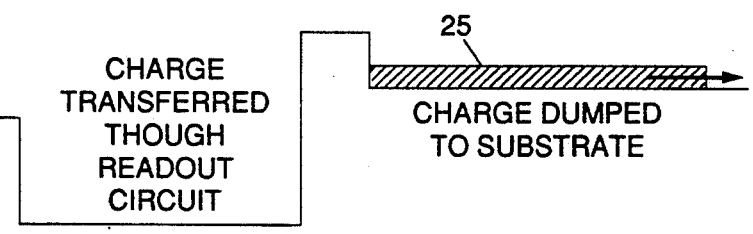
FIG. 2d shows the condition wherein a field plate is pulsed negative to turn on all diodes of the focal plane array and dump charge to the substrate.

In FIG. 2d, the field plate 17 is pulsed negative to short all diodes 18 of the focal plane array 10 to the substrate 12 and dump charge 25 to the substrate 12. The shorting of the diode 18 to the substrate 12 occurs due to edge leakage breakdown that is otherwise eliminated by proper biasing of the field plate 17. This has the effect of eliminating the signal charge 25 that was not transferred to the readout gate 21 (FIG. 2b) plus any photon-induced charge that was integrated after the transfer time. The pulse is typically less than 10 μs in width, and therefore has a 1/3200 duty cycle in a 30 Hz frame rate focal plane array 10.

The field plate 17 is normally biased to slightly deplete the P substrate at the edge of the PtSi cathode plate 15 to inhibit edge leakage breakdown. When the field plate 17 is pulsed negatively, excess holes are accumulated in the P substrate adjacent to the edge of the cathode plate 15 to promote edge leakage breakdown because of the high lateral field. This shorts the diode 18 and pumps excess electrons from the PtSi cathode plate 15 to the substrate 12. When the pulse is removed and the field plate 17 returns to its more positive potential, the edge breakdown is eliminated, the diode 18 is reverse biased, and the isolated cathode plate 15 is capacitively returned to a level determined by the original pulse height.

Figure 2E:
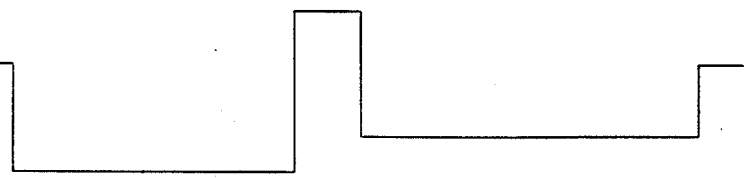
FIG. 2e shows tuning of the size of the pulse from the field-plate to reset the diode potential and provide for charge skimming.

The size of the pulse from the field-plate 17 is tuned such that the electron potential of the diode 18 in FIG. 2e returns after the pulse to a level at (for no charge skimming) or below (by the amount of desired charge skimming) the potential beneath the transfer-gate 20 when it is pulsed on in FIG. 2b. At this point, charge integration begins again. Thus, moving the trailing edge of the field-plate pulse within the frame time effectively establishes the start of the integration time, which finally ends at the diode transfer-gate pulse. This provides variable control of the integration time, thus acting as an electronic shutter. The relative values of the pulse heights on the field-plate 17 and the diode transfer-gate 20 control the amount of charge skimming.

Figure 3A:
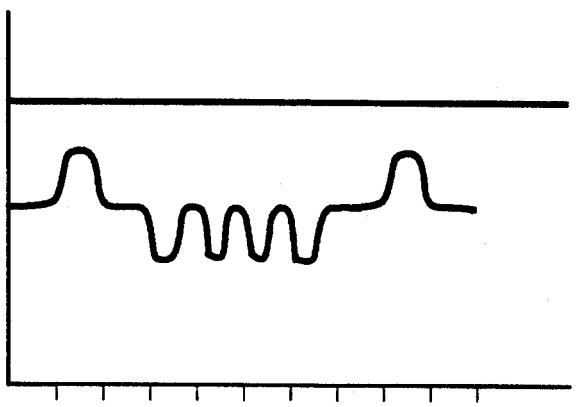
FIG. 3a shows a baseline output.
Figure 3B:
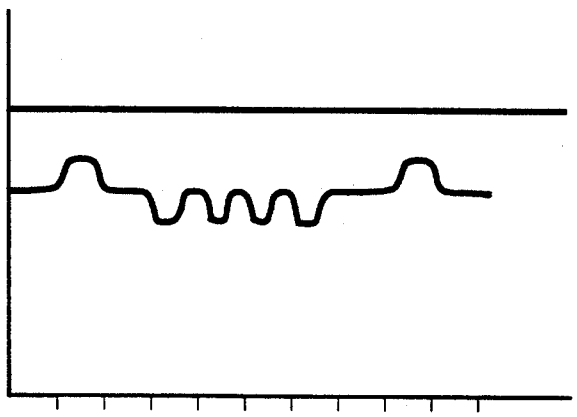
FIG. 3b shows the output with half integration time.
Figure 3C:
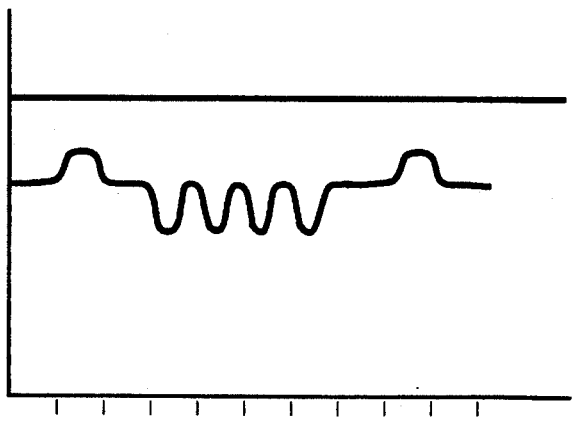
FIG. 3c shows the output with half background charge skimming.

Experiments were performed on the Schottky-barrier focal plane array 10 of the present invention and the results are as follows, with reference to the curves of FIG. 3. FIG. 3 shows oscilloscope traces of the output from the Schottky-barrier focal plane array 10 of FIG. 1 confirming the operation of variable charge skimming and variable integration times provided by the present invention. FIG. 3a shows a baseline output of the focal plane array 10, FIG. 3b shows the output with a half integration time, and FIG. 3c shows the output with half background charge skimming. It is to be understood, however, that any fraction of integration or charge skimming may be provided.

FIG. 3 shows of three oscilloscope photos representative of the output signal for a single image row in a 128×128 PtSi focal plane array 10 of the present invention. The image is that of four vertical 330° K. bars in an otherwise uniform 300° K. black body source. The output signal is uncorrected, so some pixel to pixel nonuniformity is evident along with some intensity falloff near the edges. Four charge levels are indicated in the output: the absolute zero charge level used to improve CCD readout efficiency; the injected fat zero level, which is a relative zero level; the 300° K. background signal level; and the signal representing four vertical bars that are 30° K. above the background temperature. FIG. 3a shows the output using the full integration time without charge skimming.

In FIG. 3b, the pulse on the field-plate 17 has been delayed from the beginning of the frame time to approximately the middle of the frame time. In other words, the integration time is about half that of the curve shown in FIG. 3a. The output clearly shows that the 300° K. background signal and the delta 30° K. vertical bar signal have been cut in half. This is a multiplicative effect on the signal. In FIG. 3c, the pulse on the field-plate 17 has been returned to the start of the frame, but the height of the negative pulse has been increased. The delta 30° K. bar signal is unchanged from FIG. 3a, but the 300° K. background signal has been cut in half. This is the subtractive charge skimming effect provided by the present invention.

Thus, the present invention provides a means for achieving variable integration time and charge skimming that requires no additional structures in the readout circuit of the focal plane array 10 and no increase in the readout clocking rate. The variable integration time and charge skimming effects are independent of each other and may be used in any combination by merely changing the height and location of a pulse on the field-plate 17. Although a PtSi focal plane array 10 has been reduced to practice and experiments have been done using it, the approach of the present invention may be used in any interline transfer focal plane array. By using charge skimming, especially in infrared detectors, the background signal can be largely eliminated, thus providing increased dynamic range within the available charge capacity of the readout circuit. The variable integration time feature provides contrast or gain adjustment. It also provides an electronically variable shutter speed that can be used to reduce smear in scenes involving fast moving targets or objects.

Thus there has been described a new and improved focal plane array, and specifically a Schottky-barrier focal plane array, having charge skimming and variable integration time. The major advantage of the present invention is the fact that charge skimming and variable integration time (providing for an electronic shutter) are achieved without adding any structure to the readout circuit. The present invention is achieved by pulsing the field plate that lies above the diode. The field plate takes up no additional lateral space and is one of the space saving aspects of the present Schottky-barrier focal plane array structure. It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. A focal plane array comprising a plurality of pixel elements, wherein each pixel element comprises:

a substrate;

a doped region connected to a diode disposed in the substrate;

a cathode plate formed on the surface of the substrate, and wherein the substrate, doped region, and cathode plate form the diode;

an insulating layer disposed over the cathode plate, the doped region, and the substrate;

a field plate disposed above the cathode plate and separated therefrom by the insulating layer;

a transfer gate disposed above the substrate that is laterally separated from the cathode plate, the doped region, and the field plate, and that is separated therefrom by the insulating layer;

a readout gate disposed above the substrate that is laterally separated from the transfer gate and that is separated from the substrate by the insulating layer, and wherein a portion of the transfer gate overlaps the readout gate: and a controller coupled to the field plate and the transfer gate that is adapted to pulse the transfer gate to a predetermined potential relative to potentials of the field plate and substrate to transfer charge to the readout circuit and produce a predetermined amount of charge skimming in the focal plane array, and pulse the field plate with a predetermined voltage to forward bias the diode and dump charge to the substrate, reset its potential, and suppress charge integration therein, and wherein the controller is adapted to produce a field plate pulse whose relative location within a frame time determines the starting time for charge integration, wherein the size of the field plate pulse relative to the potentials of the transfer gate and the substrate determines the amount of charge that is dumped.

2. The focal plane array of claim 1 wherein the diode comprises a Schottky-barrier diode.

3. The focal plane array of claim 1 which further comprises means for pulsing the field plate with a negative voltage at a predetermined time during a frame period and at a predetermined voltage level to forward bias the diode to dump charge to the substrate, reset its potential, and suppress charge integration therein to provide for a variable integration time and to produce a predetermined amount of charge skimming in the focal plane array.

4. The focal plane array of claim 1 which further comprises means for providing a variable integration time in the focal plane array that comprises means for controlling the location of the trailing edge of the field plate pulse applied to the field plate within the frame time to control the start of integration time, and to provide variable control of the integration time of the focal plane array.

5. A method for use with a focal plane array comprising a substrate, a plurality of diodes each having a field plate disposed thereover and a transfer gate disposed adjacent thereto, and a readout circuit coupled to each diode, said method comprising the steps of:

pulsing the transfer gate to a predetermined potential relative to potentials of the field plate and substrate to transfer charge to the readout circuit and produce a predetermined amount of charge skimming in the focal plane array, and pulsing the field plate above each of the plurality of diodes with a predetermined voltage at a predetermined time during a frame period to provide a starting time for charge integration and at a predetermined voltage level relative to the potentials of the transfer gate and substrate to forward bias the diode associated therewith and dump charge to the substrate, reset its potential, and suppress charge integration therein.

6. The method of claim 5 wherein the location of the pulse within a frame period determines the start of charge integration, and wherein the size of the pulse determines the amount of charge that is dumped, which produces the charge skimming in the focal plane array.

7. The method of claim 5 which further comprises the step of controlling the location of the trailing edge of the field plate pulse applied to the field plate within the frame time to control the start of integration time, and thus to provide for variable control of the integration time of the focal plane array.

8. The method of claim 5 wherein the size of the pulse applied to the field plate is tuned such that the electron potential of the diode returns after the pulse to a level at or below the potential of the pulse from the transfer-gate to provide for no charge skimming or for an amount of desired charge skimming, respectively.

9. The method of claim 8 wherein the relative values of the pulse heights on the field plate and the diode transfer-gate control the amount of charge skimming.

10. A method for use with a Schottky-barrier focal plane array comprising a substrate, a Schottky-barrier diode having a field plate disposed thereover and a transfer gate disposed adjacent thereto, and a readout circuit coupled to the Schottky-barrier diode, said method comprising the steps of:

pulsing the transfer gate to a predetermined potential relative to potentials of the field plate and substrate to transfer charge to the readout circuit and produce a predetermined amount of charge skimming in the focal plane array, and pulsing the field plate with a predetermined voltage at a predetermined time during a frame period and at a predetermined voltage level relative to potentials of the transfer gate and the substrate to forward bias the diode to dump charge to the substrate, reset its potential, and suppress charge integration therein, and wherein the location of the field plate pulse within a frame period determines the start of charge integration, and wherein the size of the field plate pulse relative to the potentials of the transfer gate and the substrate determines the amount of charge that is dumped.

11. The method of claim 10 which further comprises the step of controlling the location of the trailing edge of the field plate pulse applied to the field plate within the frame time to control the start of integration time, and thus to provide for variable control of the integration time of the focal plane array.

* * * * *